United States Patent [19]
Knoedl, Jr. et al.

[11] Patent Number: 5,987,335
[45] Date of Patent: Nov. 16, 1999

[54] COMMUNICATION SYSTEM COMPRISING LIGHTNING PROTECTION

[75] Inventors: George Knoedl, Jr., Milford; Avinoam Kornblit, Highland Park, both of N.J.

[73] Assignee: Lucent Technologies Inc., Murray Hill, N.J.

[21] Appl. No.: 08/937,126

[22] Filed: Sep. 24, 1997

[51] Int. Cl.$^6$ ....................................................... H04B 1/00
[52] U.S. Cl. ........................... 455/561; 455/117; 455/217
[58] Field of Search .................................. 455/117, 217, 455/560, 561, 575, 90, 128, 347, 300, 301; 174/2, 17 KG, 3, 17 R, 450, 135 R; 361/1, 5, 6, 117, 118, 119, 120; 244/1 A, 904; 343/872, 720, 841; 337/32, 33, 34

[56] References Cited

U.S. PATENT DOCUMENTS

| | | | |
|---|---|---|---|
| 3,654,520 | 4/1972 | Graneau | 361/120 |
| 3,662,083 | 5/1972 | Constant | 174/4 |
| 5,563,471 | 10/1996 | Mitami | 361/120 |
| 5,652,690 | 7/1997 | Mansfield et al. | 361/117 |
| 5,749,178 | 5/1998 | Garmong | 174/35 R |

OTHER PUBLICATIONS

V. A. Avrutskii et al., *Electrical Technology*, No. 1, pp. 15–21 (1993).
S. C. Brown, *Introduction to Electrical Discharges In Gases*, John Wiley & Sons, pp. 211–225 (1966).

Primary Examiner—Reinhard J. Eisenzopf
Assistant Examiner—Makoto Aoki
Attorney, Agent, or Firm—Eugen E. Pacher

[57] ABSTRACT

At least the power portion of the transmitter and the front end of the receiver of a base station of a wireless communication system are advantageously co-located with the antenna (or antennae), typically atop a tower or other elevated feature. Such co-location however exposes the electronics to lightning damage. This is avoided by placement of the electronics and antenna into lightning protection apparatus that is transparent to rf radiation during lightning-quiescent conditions but is a Faraday cage during a lightning strike, reverting to the transparent condition at the conclusion of the strike. This is achieved by placement of the electronics and antenna inside a housing that comprises a dielectric chamber filled with ionizable gas in contact with electrodes selected such that, during a lightning strike, current can flow between the electrodes.

11 Claims, 2 Drawing Sheets

COMMUNICATION SYSTEM COMPRISING LIGHTNING PROTECTION

FIELD OF THE INVENTION

This invention pertains to lightning protection for communication systems and other lightning-sensitive systems.

BACKGROUND

Wireless communication systems are growing by leaps and bounds. Thus, there is interest in designing and installing apparatus that is smaller, less obtrusive, less expensive, more robust, and highly efficient.

For instance, it is current practice to locate base station electronic equipment on the ground, and the base station antenna atop a tower or other elevated feature. However, this physical separation between the electronics and the antenna causes loss in signal transmission between the electronics and the antenna. This in turn necessitates provision of higher signal power, lower noise receiver amplifiers and/or high quality transmission cable, all adding to the cost of the system.

Thus, it would be of interest to have available a communication system that is less subject to the above and other shortcomings. This application discloses such a system.

V. A. Avrutskii et al., *Electrical Technology*, No. 1, p. 15–21 (1993), disclose a segmented lightning diverter as a means of gas discharge lightning protection.

SUMMARY OF THE INVENTION

This invention exemplarily is embodied in a wireless communication system that comprises one or more base stations, with a given one of the base stations comprising conventional electronics and an elevated antenna. Significantly, at least a portion of the electronics is co-located with the antenna. Furthermore, the given base station comprises lightning protection apparatus that essentially removes the electronics from the environment of the lightning.

The electronics that is substantially co-located with the antenna will be referred to as the "tower-top" electronics. It typically comprises at least the power portion of a transmitter and the "front end" of a receiver. The terms "power portion of the transmitter" and "front end of the receiver" are well understood by those skilled in the art.

The lightning protection apparatus comprises a housing that essentially encloses the tower-top electronics and the antenna, and that is essentially transparent to the communication signals during lightning-quiescent periods. During a lightning strike the housing is transformed into a Faraday cage that allows the lightning current to flow to ground. The means for accomplishing this are described in detail below.

More specifically, the invention is embodied in a wireless communication system that comprises one or more base stations. A given one of the base stations comprises a transmitter, a receiver, and an antenna connected to at least one of the transmitter and receiver.

Significantly, at least a portion of the transmitter and a portion of the receiver are co-located with the antenna, and the given base station comprises lightning protection apparatus. The lightning protection apparatus comprises an inner dielectric shell that at least partially encloses the tower-top electronics and antenna, and further comprises an outer dielectric shell that at least partially encloses the inner dielectric shell and defines a space between the inner and outer dielectric shells. This space will be referred to as the "plasma chamber". The apparatus further comprises spaced apart first and second metal electrodes, with each of the electrodes extending over the plasma chamber. The apparatus still further comprises ionizable gas confined in the plasma chamber, an elongate conductive member (typically a lightning rod) connected to the first electrode, and a conductor to ground that is connected to the second metal electrode and serves to conduct the lightning current to ground.

DETAILED DESCRIPTION OF EXEMPLARY EMBODIMENTS

Figure 1:
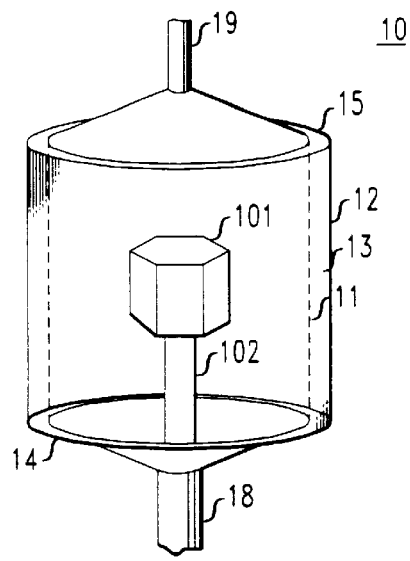
FIG. 1 schematically depicts exemplary lightning protection apparatus according to the invention, with equipment to be protected inside the housing.

FIG. 1 schematically depicts exemplary lightning protection apparatus 10 according to the invention. Numeral 101 refers to the protected (tower-top) equipment, numerals 11–13 refer to the inner dielectric shell, outer dielectric shell, and plasma chamber between the shells, respectively. Numerals 14 and 15 refer to the lower and upper metal electrodes, respectively. Numerals 18 and 19 refer to the conductor to ground and to the lightning rod, respectively, and numeral 102 refers to a mechanical support for the protected equipment, which includes an antenna, not shown. Electrical connections to the tower-top electronics can be conventional and are not shown. Typically they are located concentrically within support tube 102 and conductor to ground 18. Feature 102 exemplarily is, in addition to a mechanical support, a conducting conduit ("frame ground"), insulated from conductor 18, connecting the tower-top electronic equipment to ground. All other electrical and signal connections between the tower-top electronics and optional equipment at the base of the tower are run concentrically through mechanical support and conduit 102.

When the lightning protection apparatus is in the quiescent state, the upper electrode is electrically isolated from the lower electrode, no current flows between them and the housing is transparent to radio waves. On the other hand, in the active state of the apparatus, the gas in plasma chamber 13 is ionized, such that current can flow between the electrodes. The protected equipment thus is located inside a Faraday cage during a lightning strike, and automatically reverts to the quiescent state after the lightning strike.

Many of the characteristics of lightning are well known. For instance, it is well known that a lightning strike typically commences with a "leader" in the direction opposite to that of the high current return stroke. A ground-to-cloud leader may carry about 100–1000 A and last some hundreds of microseconds before the return stroke. The leader may emanate from a tower top, lightning rod or other elevated feature. The return stroke may carry some 10 Coulombs of charge, with peak currents of typically around 30 kA, and there is typically a delay of order tens to hundreds of microseconds between origination of the leader and arrival of the return stroke. This delay facilitates operation of the lightning protection according to the invention, as will be described below.

It is important that, at arrival of the high current return stroke at the lightning protection apparatus according to the invention, the gas in the plasma chamber not only be ionized (i.e., that a plasma is present in the space) but also that the plasma be in an essentially uniformly conducting state.

Figure 2:
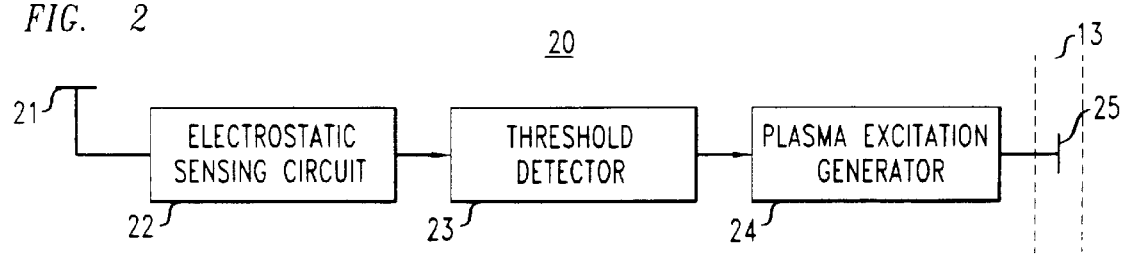
FIG. 2 schematically shows an embodiment of the invention that comprises means for using the pre-strike electrostatic field to trigger plasma formation.

If the protected equipment can withstand the induction from imbalanced time-varying magnetic fields accompanying the comparatively low current leader, the leader itself can serve as a precursor to establish the plasma. On the other hand, if the protected equipment can not withstand the induction from the leader, the plasma may be deliberately pre-established. This can be accomplished by any suitable process, e.g., by injection of a dc or ac current into the gas, or by impinging a high power local rf field onto the gas. Pre-establishment can, for instance, be triggered by a technique that utilizes the known fact that, just prior to a lightning strike, the atmospheric electrostatic field in the threatened area is large, typically exceeding 10 kV/m. Thus, the local atmospheric electrostatic field exemplarily can be used as an indicator from which, when a predetermined threshold is exceeded, a trigger to strike the plasma is generated. This is schematically depicted in FIG. 2, wherein numeral 20 refers to the lightning threat-detecting plasma ignator that is an optional feature of an article according to the invention. Numeral 21 refers to an electrostatic field sensing probe, and numerals 22–24 refer, respectively, to an electrostatic sensing circuit that provides an output proportional to the electrostatic field at probe 21, a threshold detector that provides an output when the output of sensing circuit 22 exceeds a predetermined level, and a plasma excitation generator that delivers, in response to the output of the threshold detector, an ionizing field to plasma chamber 13 via induction electrode (or coil) 25.

The electronic components of the plasma ignator 20 can be disposed within the housing of the lightning protection apparatus 10, can be disposed within a separate conductive enclosure (not shown), or could, at least in principle, even be left unprotected. Circuits 22–24 can be readily provided by one of ordinary skill of analog circuit design.

Almost any gas, at pressures in the approximate range of 0.1 to 100 Torr, depending upon the gas, will support a uniform plasma under dc discharge if operated in the anomalous glow discharge region of its electrical characteristic. See, for instance, "Introduction to Electrical Discharges in Gases", S. C. Brown, Wiley 1966, pp. 211–225. In a glow discharge the entire electrode glows, indicating uniform ionization, the condition necessary in a device according to the invention to ensure formation of a uniform plasma sheet which will carry uniform current density all around the circumference of the structure. Beyond current densities where anomalous glow discharge occurs lies the arc discharge region, in which the metal electrodes participate actively, and the potential across the structure drops to very low values. These general characteristics are common to most gases over a wide range of pressures. The condition for anomalous glow discharge is met, for example, in an NE-2H neon indicator lamp at current densities exceeding about 1 mA/cm$^2$ up to about 200 mA/cm$^2$. Exemplarily, the gas in the plasma chamber in lightning protection apparatus according to the invention is neon at about 10 Torr.

When a discharge device is operated in the arc discharge region, cathode erosion due to sputtering typically occurs. By coating the electrodes with a thin film of carbon, electrode erosion can be delayed, and device lifetime can be increased.

By proper selection of the gas pressure it can be ensured that the plasma dependably strikes such that the entire cathode is involved. This is highly desirable because, if ionization is not produced by the entire cathode, the plasma might form in streaks, not maintaining a uniform current sheet around the circumference of the device, and failing to provide adequate protection. For a given gas or gas mixture, a pressure that provides uniform ionization is readily determined by simple, well known procedures.

Additional measures can be taken to ensure uniform plasma nucleation. These include illumination of the electrodes to generate photo-electrons, and/or introduction of a trace amount of an appropriate radioactive isotope to ionize the gas. The alpha-and/or beta-particles produced by the radioactive decay are typically unable to penetrate the dielectric shells and present no radiation hazard.

The above recited means can ensure the presence of some ionized gas atoms to seed the formation of a plasma, thereby stabilizing the striking potential.

Figure 3:
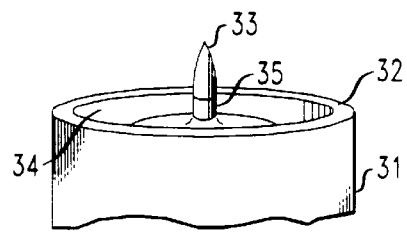
FIG. 3 schematically shows an exemplary lightning rod with sharp-tipped and blunt-tipped electrode.

Plasma ignition can also be facilitated by provision of an electrode with a sharp pointed feature that locally generates a large electric field. However, the small cross sectional area of a sharp tip that could serve as plasma ignitor makes the tip vulnerable to damage by the massive return stroke current. Such damage can be avoided by further providing a heavier, more blunt electrode, connected to the sharp-tipped electrode through a large value resistor (e.g., 1 MΩ). The sharp-tipped electrode will initiate electrical breakdown dependably (either in the plasma chamber or on the lightning rod), and the blunt electrode will carry the lightning current without sustaining significant damage. Once breakdown has taken place, the resistor limits the current into the sharp-tipped electrode, preventing damage thereto. FIG. 3 schematically depicts an exemplary embodiment of the dual electrode, a lightning rod with a sharp-tipped and a blunt-tipped electrode. In FIG. 3, numeral 31 refers to the top portion of the lightning rod that ends in blunt electrode 32. In recess 34 is disposed resistor 35, with sharp-tipped electrode 33 disposed on the resistor.

Figure 4:
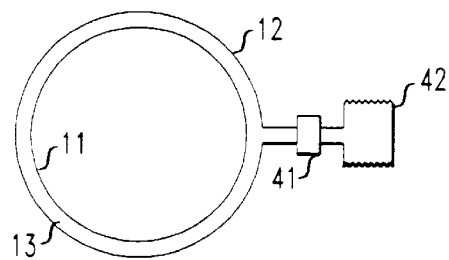
FIG. 4 schematically depicts an exemplary device with an extendible bladder.

Under some circumstances (e.g., a moderate to light lightning strike that generates a relatively large voltage drop across the plasma, with consequent relatively high dissipated power) the gas in the plasma chamber may be heated to a temperature high enough to result in undesirably high gas pressure. This can be prevented by provision of an auxiliary container (e.g., an extendible "bladder") that is connected to the plasma chamber. The auxiliary container can expand to relieve the pressure rise in the plasma chamber until the gas cools, when the gas in the "bladder" is returned to the plasma chamber. FIG. 4 schematically shows an exemplary embodiment, wherein numeral 42 refers to an extendible bladder, and numeral 41 refers to a conventional vacuum-tight connection between a port in outer shell 12 and the bladder.

At times it may, for economic reasons or for easier service access, be necessary or desirable to form the housing in segments. Lightning protection apparatus with housing will typically require means for ensuring simultaneous plasma formation in all segments, and substantially uniform current density all around the segmented housing. Similar considerations apply if there are two or more co-located lightning protection devices.

Figure 5:
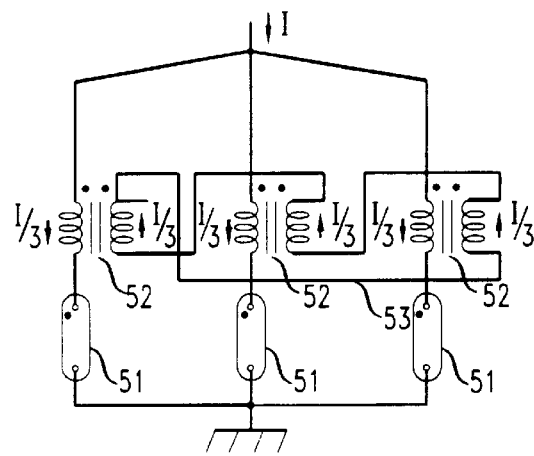
FIG. 5 is a circuit schematic for an exemplary apparatus segmented plasma chamber.

Such means could be resistors in series with each segment or separate device (of a co-located multiplicity of devices), the resistors selected to ensure that the necessary potential is available to establish the plasma in each plasma chamber, and is not shunted away by the first chamber to strike. More preferred however is the approach that is schematically shown in FIG. 5 for a 3-segment device. In the embodiment of FIG. 5, current I from the lightning rod flows to ground through three plasma chambers 51 and through the primary windings of three one-turn transformers 52, in series with the respective plasma chambers. The secondary windings are connected in series in a closed loop 53. The arrangement of FIG. 5 forces the current to be the same in every leg, and will develop the necessary excess potential in any leg or legs to ensure this condition.

Figure 6:
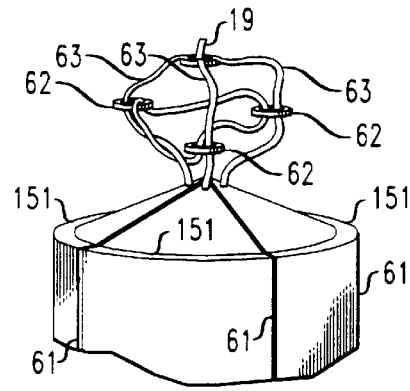
FIG. 6 schematically depicts relevant features of an apparatus with segmented plasma chamber.

FIG. 6 schematically shows an exemplary implementation of the connection scheme of FIG. 5. In FIG. 6, numerals 61 refer to the three segments, numerals 151 refer to the three upper electrodes, and numerals 72 refer to toroidal magnetic cores. Conductors 63 connect the lightning rod to the respective electrodes, and are threaded through the respective magnetic cores, forming the transformer primary. Conductor 64 is also threaded through the respective cores, forming the transformer secondary. During a lightning strike, the secondary current opposes the primary current, and thus the net magnetic flux in the cores (which ideally is zero) will be considerably less than what is implied by the primary current, typically avoiding core saturation.

To avert large time-varying magnetic fields due to the current circulating in the secondary conductor loop from impinging on the equipment to be protected, it is possible to buck the magnetic field around the secondary conductor by closing the loop with another conductor running the reverse way. Such bucking schemes are known and do not require detailed description.

Figure 7:
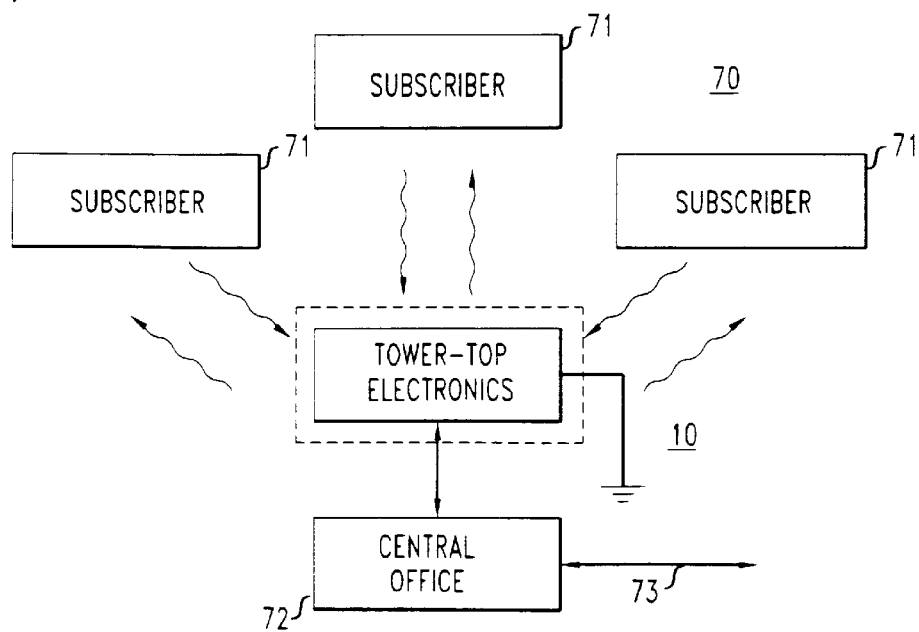
FIG. 7 schematically shows a wireless communication system.

FIG. 7 schematically depicts a relevant portion of a wireless communication system 70 according to the invention, wherein numerals 71 refer to subscriber terminals (either stationary or mobile), numerals 72 and 73 refer, respectively, to an optional central office in 2-way communication with base station 10 and, typically, with the remainder of the network, as indicated by communication line 73.

Although a preferred use of the lightning protection apparatus according to the invention is the protection of tower-top electronics of wireless communication systems, the invention is not thus limited. Those skilled in the art will recognize that the apparatus can, at least in principle, be used to protect any sensitive equipment from lightning damage.

EXAMPLE I

An exemplary lightning protection apparatus according to the invention is fabricated as follows. Two polycarbonate cylinders (30 cm tall, 5 mm wall thickness, 40.6 and 45.7 cm outside diameter, respectively) are provided. The edges of the cylinders are coated with a thin film of high vacuum silicone grease. The cylinders are placed concentrically between two flat, annular copper rings (47 cm outside diameter, 38.1 cm inside diameter), to form a sealed chamber between the two cylinders. An access port to the chamber is formed by boring through the outer cylinder wall, and a vacuum pump is connected to the port. After evacuation of the chamber, the chamber is filled with a 90% argon, 10% neon mixture to 70 Torr, and the port is sealed.

The apparatus is tested and performs as expected, with substantially uniform current distribution during a lightning strike, and with electronic equipment that is surrounded by the housing suffering no lightning damage.

EXAMPLE II

In apparatus substantially as described in Example I, the annular copper rings are each provided with an array of fifty equally spaced sharply pointed electrodes. Each electrode is supported by, and is in series with, a resistive element that is mounted, facing inward, on the annular copper ring.

EXAMPLE III

Apparatus substantially as described in Example I is provided with an access port to which is attached, prior to filling the chamber with gas, a bellows-style expansion bladder formed by accordion-folding a sheet of 0.25 mm thick stainless steel.

EXAMPLE IV

To the upper electrode of lightning protection apparatus substantially as described in Example I is connected a high voltage power supply. An electric field sensing probe is placed in the vicinity of the enclosure. The probe is connected to a sensing circuit that generates a signal to activate the high voltage power supply when an electric field of 5 kV/meter or greater is detected by the probe.

EXAMPLE V

In the vicinity of lightning protection apparatus substantially as described in Example I is placed a radio-frequency generator whose radiated energy is directed into the gas-filled chamber of the enclosure. An electric field sensing probe is placed in the vicinity of the enclosure. The probe is connected to a sensing circuit that generates a signal to activate the rf generator whenever an electric field strength of 5 kV/m or more is sensed by the probe.

The invention claimed is:

1. A wireless communication system comprising one or more base stations, a given one of said base stations comprising a transmitter, a receiver, and an antenna connected to at least one of the transmitter and receiver;

characterized in that at least a portion of the transmitter and a portion of the receiver are substantially co-located with the antenna, said portions to be collectively referred to as the "tower electronics", and the given base station comprises lightning protection apparatus that comprises a) an inner dielectric shell that at least partially encloses said tower electronics and antenna;

b) an outer dielectric shell that at least partially encloses the inner dielectric shell and is spaced therefrom;

c) spaced apart first and second metal electrodes, with each of said electrodes extending over the space between the inner and outer dielectric shells;

d) ionizable gas confined in the space between the inner and outer dielectric shells, the space between the dielectric shells to be referred to as the plasma chamber; and e) an elongate conductive member connected to the first metal electrode, and a conductor to ground connected to the second metal electrode; wherein the ionizable gas is selected to be ionized at least during a part of a lightning strike of the base station.

2. System according to claim 1, wherein the tower-top electronics comprise a power portion of the transmitter and a front end of the receiver.

3. System according to claim 1, wherein the lightning protection apparatus is selected to provide circumferentially essentially uniformly ionized gas during at least a part of the lightning strike of the base station.

4. System according to claim 1, wherein the lightning protection apparatus is selected such that a lightning leader serves to at least partially ionize the ionizable gas.

5. System according to claim 3, wherein the lightning protection apparatus is selected to ionize the ionizable gas before arrival of a return stroke of the lightning strike of the base station.

6. System according to claim 5, wherein the lightning protection apparatus comprises apparatus for determining when an electrostatic field in the vicinity of the lightning protection apparatus exceeds a predetermined value, and further comprises a plasma ignator adapted for ionizing at least some of the ionizable gas when said electrostatic field exceeds said predetermined value.

7. System according to claim 6, wherein said ionizable gas is ionized by injection of a current into the plasma chamber, or by impinging a radio frequency field onto the ionizable gas.

8. System according to claim 1, wherein the elongate conductive member comprises a sharply-pointed electrode and a relatively blunt electrode, with a series resistor disposed between the sharply-pointed electrode and the relatively blunt electrode, wherein the sharply-pointed electrode is selected to facilitate plasma ignition and the relatively blunt electrode is selected to carry a current during the lightning strike.

9. System according to claim 1, wherein at least one of said first and second metal electrodes comprises a multiplicity of pairs of electrodes extending into the plasma chamber, a given pair comprising a sharply-pointed electrode and a relatively blunt electrode, with a series resistor disposed between the sharply-pointed electrode and the relatively blunt electrode, wherein the sharply-pointed electrode is selected to facilitate plasma ignition in the plasma chamber, and the relatively blunt electrode is selected to carry a current during the lightning strike.

10. System according to claim 1, wherein an extendible auxiliary chamber is connected to the plasma chamber.

11. System according to claim 1, wherein the ionizable gas comprises a gas selected from the group consisting of neon and argon.

* * * * *